(12) United States Patent
Fan

(10) Patent No.: US 10,014,440 B2
(45) Date of Patent: Jul. 3, 2018

(54) GRAPHENE DISPLAY DEVICES AND THE DISPLAY DRIVING METHODS THEREOF

(71) Applicant: Shenzhen China Star Optoelectronics Technology Co., Ltd., Shenzhen, Guangdong (CN)

(72) Inventor: Yong Fan, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 67 days.

(21) Appl. No.: 14/907,875

(22) PCT Filed: Jan. 5, 2016

(86) PCT No.: PCT/CN2016/070201
§ 371 (c)(1),
(2) Date: Jan. 27, 2016

(87) PCT Pub. No.: WO2017/088284
PCT Pub. Date: Jun. 1, 2017

(65) Prior Publication Data
US 2017/0256679 A1 Sep. 7, 2017

(30) Foreign Application Priority Data
Nov. 24, 2015 (CN) .......................... 2015 1 0823916

(51) Int. Cl.
*H01L 33/26* (2010.01)
*H01L 33/44* (2010.01)
(Continued)

(52) U.S. Cl.
CPC .............. *H01L 33/26* (2013.01); *G09G 5/02* (2013.01); *G09G 5/10* (2013.01); *H01L 27/156* (2013.01);
(Continued)

(58) Field of Classification Search
CPC ... H01L 33/26; H01L 33/156; H01L 33/0041; H01L 33/44; H01L 27/156; G09G 5/02; G09G 5/20
See application file for complete search history.

(56) References Cited

U.S. PATENT DOCUMENTS 8,865,515 B2 * 10/2014 Na .................. B82Y 10/00
257/E51.018
2004/0174389 A1 * 9/2004 Ben-David .......... G09G 3/3413
345/694
(Continued)

FOREIGN PATENT DOCUMENTS

CN 101267701 A 9/2008
CN 101984487 A 3/2011
(Continued)

*Primary Examiner* — Ariel Balaoing
(74) *Attorney, Agent, or Firm* — Andrew C. Cheng

(57) ABSTRACT

A graphene display device includes a graphene display unit and a display control unit electrically connected with the graphene display unit. The graphene display unit includes a plurality of graphene light emitting structures constituting dynamic sub-pixels of the graphene display unit. The graphene display unit is configured for dividing pixel gamut of multiple base colors of pixels of the graphene display unit. A relationship between the pixel gamut and a pixel gamut coordinate is configured, and the graphene display unit controls the dynamic sub-pixel to display corresponding light in accordance with the pixel gamut coordinate of the inputted pixel. In addition, a display driving method of graphene display devices is disclosed. The graphene display device may accomplish multiple base colors display with fewer pixels such that wider color gamut coverage may be provided, and the aperture rate of the display device is enhanced and the power consumption is reduced.

10 Claims, 7 Drawing Sheets

(51) Int. Cl.
*G09G 5/02* (2006.01)
*G09G 5/10* (2006.01)
*H01L 27/15* (2006.01)
*H01L 33/00* (2010.01)
*H01L 29/786* (2006.01)
*H01L 29/16* (2006.01)
*H01L 29/24* (2006.01)
*H01L 33/34* (2010.01)
*H01L 29/49* (2006.01)

(52) U.S. Cl.
CPC .......... *H01L 33/0041* (2013.01); *H01L 33/44* (2013.01); *G09G 2300/0452* (2013.01); *G09G 2300/0465* (2013.01); *G09G 2310/08* (2013.01); *G09G 2320/064* (2013.01); *G09G 2320/0666* (2013.01); *G09G 2330/023* (2013.01); *H01L 29/1606* (2013.01); *H01L 29/24* (2013.01); *H01L 29/4908* (2013.01); *H01L 29/7869* (2013.01); *H01L 29/78684* (2013.01); *H01L 33/34* (2013.01)

(56) References Cited

U.S. PATENT DOCUMENTS

| | | | |
|---|---|---|---|
| 2008/0001890 A1 | 1/2008 | Song | |
| 2011/0285759 A1 | 11/2011 | Sakai | |
| 2012/0205676 A1 | 8/2012 | Seo | |
| 2013/0256629 A1* | 10/2013 | Lee | H01L 27/283 257/13 |
| 2014/0231758 A1* | 8/2014 | Mok | H01L 51/5296 257/40 |

FOREIGN PATENT DOCUMENTS

| | | |
|---|---|---|
| CN | 102292761 A | 12/2011 |
| CN | 102403430 A | 4/2012 |
| CN | 102651339 A | 8/2012 |
| CN | 102682724 A | 9/2012 |
| CN | 104282678 A | 1/2015 |
| CN | 104680948 A | 6/2015 |
| CN | 104766572 A | 7/2015 |

* cited by examiner

GRAPHENE DISPLAY DEVICES AND THE DISPLAY DRIVING METHODS THEREOF

BACKGROUND OF THE INVENTION

1. Field of the Invention

The present disclosure relates to display technology, and more particularly to a graphene display device and the display driving method thereof.

2. Discussion of the Related Art

Graphene materials are characterized by attributes such as hard texture, high transparency (transmittance≈97.7%), high thermal conductivity (up to 5300 W/m·K) and high electron mobility (more than 15000 cm2/V·s), and thus are applicable to display devices. Particularly, the graphene materials have been adopted in touch panels and LEDs to replace traditional ITO.

In recent years, due to the graphene-emitting element, such as graphene diode emerges, the graphene applications can be expanded in the display field. The displayed color of Graphene LEDs emission color may be changed by adjusting the gate voltage.

The principle is, the size of the electric field generated by the gate voltage of the semiconductor can be adjusted to restore the Fermi energy level of graphene oxide so as to adjust the emission wavelength of the graphene. Nowadays, it is a critical issue about how to provide more vivid display, a wider color gamut coverage and lower power consumption.

SUMMARY

In view of the above, it is necessary to provide a graphene display device and the display driving method, wherein the power consumption is low and the color gamut coverage is high.

In one aspect, a graphene display device includes: a graphene display unit and a display control unit electrically connected with the graphene display unit, the graphene display unit includes a plurality of graphene light emitting structures constituting dynamic sub-pixels of the graphene display unit, wherein: the graphene display unit is configured for dividing pixel gamut of multiple base colors of pixels of the graphene display unit, a relationship between the pixel gamut and a pixel gamut coordinate is configured, and the graphene display unit controls the dynamic sub-pixel to display corresponding light in accordance with the pixel gamut coordinate of the inputted pixel.

Wherein the light emitting structure includes a light emitting layer, a gate, a source, and a drain, the display control unit controls a displayed color of the dynamic sub-pixel in accordance with a gate voltage.

Wherein the gate covers the light emitting layer, and the source and the drain are arranged on one side of the light emitting layer facing away the gate.

Wherein the light emitting layer is reduced graphene oxide semiconductor; and/or the gate is graphene oxide; and and/or the source and the drain are reduced oxide graphene.

Wherein the graphene display unit includes a first transparent substrate and a second transparent substrate, and the light emitting structure is arranged between the first transparent substrate and the second transparent substrate.

Wherein the graphene display unit includes a first transparent substrate and a second transparent substrate, and the light emitting structure is arranged between the first transparent substrate and the second transparent substrate.

Wherein the graphene display unit includes a first transparent substrate and a second transparent substrate, and the light emitting structure is arranged between the first transparent substrate and the second transparent substrate.

Wherein the graphene display device further includes a protection layer covering the light emitting structure, and the second transparent substrate covers the light emitting structure and the protection layer; and/or the graphene display unit includes a masking layer formed on one surface of the first transparent substrate facing toward the second transparent substrate; and/or the graphene display unit includes a reflective layer formed on one surface of the first transparent substrate facing away the light emitting structure.

Wherein each of the pixels of the graphene display unit includes three graphene light emitting structures operating as the dynamic sub-pixels, the display control unit controls the three dynamic sub-pixels to display five base colors in accordance with the pixel gamut coordinates of the inputted pixel; or each of the pixels of the graphene display unit includes one graphene light emitting structure operating as the dynamic sub-pixel, the display control unit controls the dynamic sub-pixel to display five base colors in accordance with the pixel gamut coordinates of the inputted pixel.

Wherein: when each of the pixels of the graphene display unit includes three graphene light emitting structures operating as the dynamic sub-pixels, within the XY coordinate system, the pixel color gamut includes five triangular areas having WBR, WCB, WGC, WYG, and WRY, each of the triangular areas corresponds to one displayed color of the dynamic sub-pixel; when each of the pixels of the graphene display unit includes one graphene light emitting structure operating as the dynamic sub-pixel, the display control unit divides the timing sequences of the pixel gamut, each of the timing sequences is configured with one displayed color corresponding to the graphene dynamic sub-pixel, and the displayed color and the timing sequence of the three base colors are determined in accordance with the pixel gamut coordinate of the inputted pixel.

In another aspect, a display driving method of graphene display devices includes: dividing a color gamut of pixel and configuring relationship between a pixel gamut coordinate and the color gamut; and determining the corresponding gamut of the pixel in accordance with the color gamut coordinate of the inputted RGB pixel, and determining a displayed color of the graphene dynamic sub-pixel in accordance with the color gamut.

Wherein the method further includes adopting three graphene dynamic sub-pixels to display multiple base colors, and the step further includes: within a XY coordinate system, dividing the pixel gamut into a plurality of multiple base colors display areas, each of the display areas is configured with one corresponding displayed color of the graphene dynamic sub-pixel; determining location of the pixel gamut in accordance with the pixel gamut coordinate and displaying the corresponding displayed color when the graphene dynamic sub-pixel is controlled in accordance with the location; or adopting one graphene dynamic sub-pixel to display multiple base colors, and the step further includes: dividing timing sequences of the pixel gamut, and each of the timing sequences corresponds to the displayed color of the graphene dynamic sub-pixels; and determining the corresponding timing sequence and color of the pixel gamut coordinate in accordance with the pixel gamut coordinate of the inputted pixel, and determining the corresponding displayed color when the graphene dynamic sub-pixel is controlled in accordance with the location.

In view of the above, the graphene display device may accomplish multiple base colors display with fewer pixel such that a wider color gamut coverage may be provided, and thus the aperture rate of the display device may be enhanced and the power consumption may be reduced.

DETAILED DESCRIPTION OF THE EMBODIMENTS

Embodiments of the invention will now be described more fully hereinafter with reference to the accompanying drawings, in which embodiments of the invention are shown.

Figure 1:
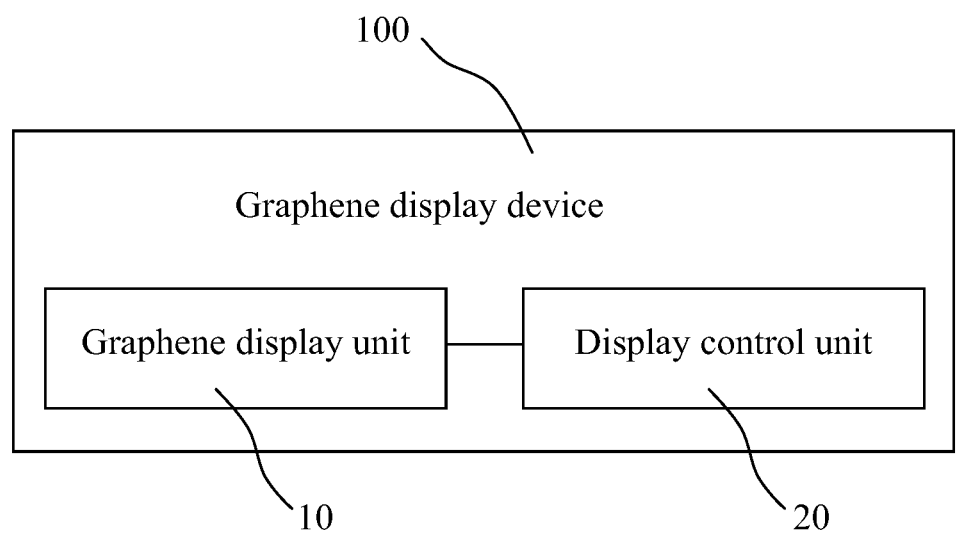
FIG. 1 is a schematic view of graphene display device in accordance with one embodiment.

Referring to FIG. 1, the graphene display device 100 includes a graphene display unit 10 and a display control unit 20. The display control unit 20 and the graphene display unit 10 are electrically connected. The display control unit 20 is configured for controlling a corresponding color and/or brightness of the graphene display unit 10.

Figure 2:
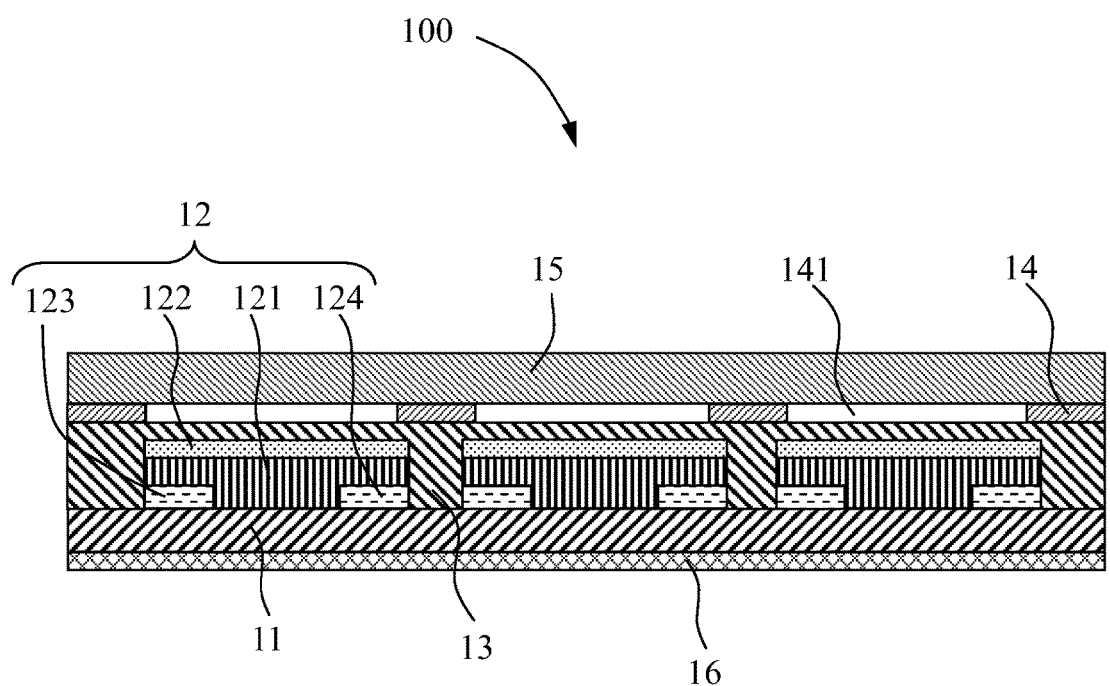
FIG. 2 is a schematic view of the display unit of the graphene display device of FIG. 1.

Referring to FIG. 2, the graphene display unit 10 includes a first transparent substrate 11, at least one light emitting structure 12, a protection layer 13, a masking layer 14 and a second transparent substrate 15. The light emitting structure 12 is arranged on one side of the first transparent substrate 11, the protection layer 13 covers the light emitting structure 12, the second transparent substrate 15 covers the light emitting structure 12 and the protection layer 13, and the masking layer 14 is formed on one surface of the first transparent substrate 11 facing toward the second transparent substrate 15.

In the embodiment, the first transparent substrate 11 and the second transparent substrate 15 are glass substrates, which not only permit light beams to pass through, but also support the graphene display unit 10. It can be understood that in other embodiments, the first transparent substrate 11 and the second transparent substrate 15 may be made by other transparent materials, such as polyethylene terephthalate (PET) or nickel. In addition, the first transparent substrate 11 and the second transparent substrate 15 may be made by the same or different materials.

The number of the light emitting structures 12 may be configured in accordance with requirements of the graphene display device 100. Each of the light emitting structures 12 may include a light emitting layer 121, a gate 122, a source 123, and a drain 124. The gate 122 covers one surface of the light emitting layer 121 facing toward the second transparent substrate 15, and the source 123 and the drain 124 are arranged on one side of the light emitting layer 121 facing away the gate 122. In the embodiment, the light emitting layer 121 may be reduced graphene oxide semiconductor, the gate 122 may be graphene oxide, and the source 123 and the drain 124 may be reduced oxide graphene.

In view of experimental results, with respect to the graphene display device 100, the light emitting layer 121 may emit lights of different colors in accordance with the voltage of the gate 122. For instance, when the gate voltage (Vgs) is of 0-10 voltage and the source/drain voltage (Vds) is larger than a turn-on voltage (Vth), the light emitting structure 12 emit red lights. When the gate voltage (Vgs) is of 20-30 voltage and the source/drain voltage (Vds) is larger than the turn-on voltage (Vth), the light emitting structure 12 emit green lights. When the gate voltage (Vgs) is of 40-50 voltage and the source/drain voltage (Vds) is larger than the turn-on voltage (Vth), the light emitting structure 12 emit blue lights. By changing the voltage of Vds, the intensity of the light beams emitted by the light emitting structure 12 may be adjusted, such that the grayscale may be adjusted.

Thus, each of the light emitting structures 12 constitutes a dynamic pixel such that the color displayed by the light emitting structure 12 may be adjusted by controlling the gate voltage (Vds). Each of the light emitting structures 12 not only can emit light beams of three base colors (RGB), but also can emit light beams of red, green, blue, yellow, and cyan (RGBYC) or more colors. Thus, a wider color gamut coverage may be provided, and thus the aperture rate of the display device may be enhanced and the power consumption may be reduced.

Specifically, three light emitting structures 12 may constitute one pixel of the graphene display unit 10, and each of the light emitting structures 12 may be one dynamic sub-pixel.

Figure 3:
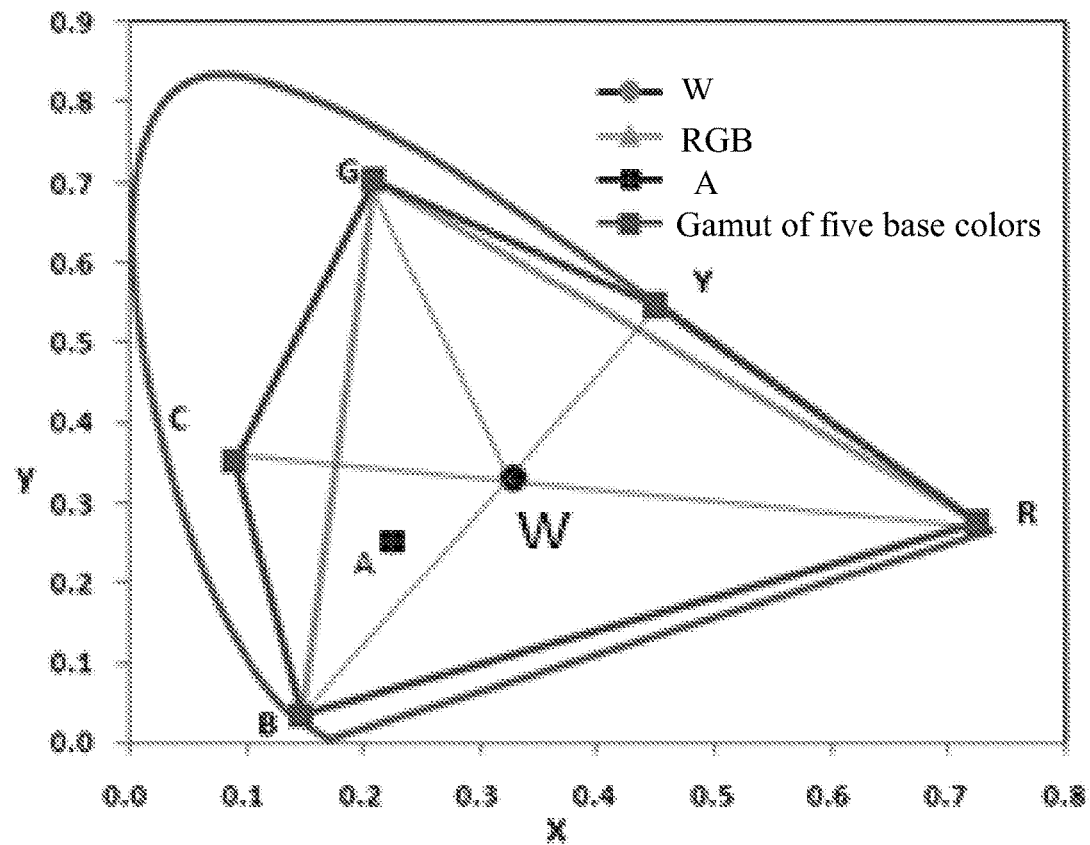
FIG. 3 is a distribution diagram showing the five-color gamut of the graphene display device of FIG. 1 in XY coordinate system.

In order to display more base colors, the color gamut of the pixels has to be divided. The corresponding grayscale and color may be outputted in accordance with the grayscale values of the input signals and the pixel gamut coordinate. Specifically, FIG. 3 is a distribution diagram showing the five-color gamut of the graphene display device of FIG. 1 in XY coordinate system. The pixel color gamut includes five triangular areas including WBR, WCB, WGC, WYG, and WRY. The triangular areas are configured with predetermined relationship with the displayed colors of the dynamic sub-pixels. Each of the triangular areas has corresponding displayed color of the dynamic sub-pixel.

Thus, the input coordinate A(x, y) may determine the location of the pixel in the pixel gamut. The displayed colors of the three dynamic sub-pixels may be determined in accordance with the location of the pixel in the pixel gamut. Referring to Table 1, different coordinates A(x, y) in the pixel gamut coordinate corresponds to different displayed colors of the dynamic sub-pixels.

TABLE 1

| A (x, y) | Within WRB | Within WRB | Within WRB | Within WRB | Within WRB |
|---|---|---|---|---|---|
| Displayed color | RGB | RGC | RCB | YGB | RGB |

In addition, the grayscale of the light emitting structure 12 may be adjusted in accordance with the inputted grayscale values RiGiBi of the RGB, wherein i is in a range between 0 and 255 and i relates to the grayscale value.

In view of the above, the three dynamic sub-pixels realizes a wide color gamut coverage of five base colors, i.e., RGBYC. In this way, the saturation of the display device is high. At the same time, the number of the sub-pixels is reduced and the aperture rate of the display device may be enhanced.

In addition, the pixel of the graphene display unit 10 may be formed by only one light emitting structure 12. That is, each of the pixels of the graphene display unit 10 only includes one dynamic sub-pixel. The wide color gamut of multiple base colors may be realized by the timing sequence diving method.

Specifically, in an example, five colors including RGBYC is driven by the timing sequence at 180 HZ. First, the timing sequence of the pixel color gamut is divided. Each of the timing sequences is configured with a corresponding color of the dynamic sub-pixel. The color and the timing sequence of the three base colors may be determined by the pixel gamut coordinate A(x, y). The gate voltage (Vgs) and the source/drain voltage (Vds) may be adjusted in accordance with the displayed color and the timing sequence so as to realize the full-color driving of multiple colors.

Figure 4:
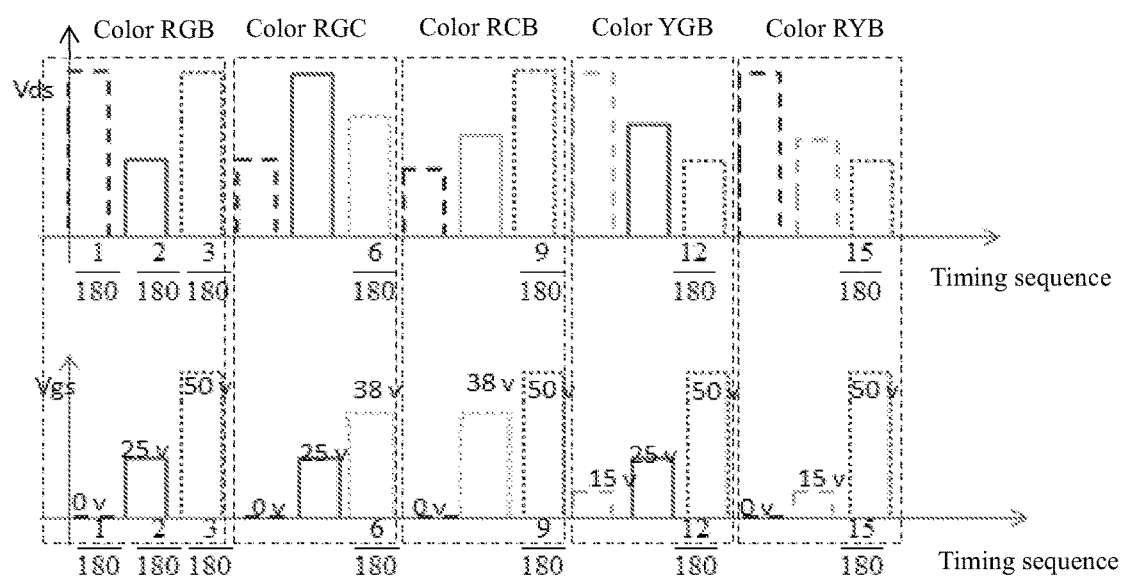
FIG. 4 is a timing distribution diagram showing the five-color gamut of the graphene display device of FIG. 1.

FIG. 4 is a timing distribution diagram showing the five-color gamut of the graphene display device of FIG. 1. In FIG. 4, each of the seconds is divided into 180 parts in accordance with timing sequences. Within each of the divided timing sequence, the gate voltage (Vgs) and the source/drain voltage (Vds) are adjusted in accordance with the displayed color. The three displayed colors of the three adjacent timing sequences form the three base colors. For instance, within $\frac{1}{180}$ seconds, a first color is displayed at a predetermined grayscale when the gate voltage (Vgs) and the source/drain voltage (Vds) are controlled by the inputted timing sequence. Within $\frac{2}{180}$ seconds, a second color is displayed at a predetermined grayscale when the gate voltage (Vgs) and the source/drain voltage (Vds) are controlled by the inputted timing sequence. Within $\frac{3}{180}$ seconds, a third color is displayed at a predetermined grayscale when the gate voltage (Vgs) and the source/drain voltage (Vds) are controlled by the inputted timing sequence.

The light beams of the three timing sequences are mixed to form the lights of the predetermined color. Thus, the timing sequence driving method may display the multiple base colors to achieve full-color gamut display by one dynamic sub-pixel. With such driving method, the number of the sub-pixels is reduced and the aperture rate of the display device may be enhanced.

Referring to FIG. 2, the protection layer 13 is configured for protecting the light emitting structure 12 such that the light emitting structure 12 is prevented from being damaged by the intrusion of water, gas, and other impurity. In the embodiment, the protection layer 13 is made by SiO2.

The masking layer 14 is configured for masking the leakage of background lights to enhance the contrastness, avoid color mixture, and increase the purity of the color. The masking layer 14 is the opaque portion formed between the light emitting structures 12. The masking layer 14 corresponds to the light emitting structure 12, the masking layer 14 includes at least one breakthrough window 141 arranged in a matrix. Thus, the masking layer 14 is also called as the black matrix. Alternatively, the masking layer 14 is a chromium layer deposited on the second transparent substrate 15. Specifically, the chromium layer is formed on the second transparent substrate 15 by sputtering. Afterward, the breakthrough window 141 is formed by photolithography etching. In addition, the masking layer 14 may be formed by photolithography by resin Photoresist having black dyes.

The graphene display device 100 further includes a reflective layer 16 formed on one surface of the first transparent substrate 11 facing away the protection layer 13. The reflective layer 16 is configured for reflecting the light beams of the light emitting structure 12. Preferably, the reflective layer 16 is made by metallic material of high reflective rate.

The display control unit 20 is configured for controlling the dynamic sub-pixels of the graphene display unit 10 to display in accordance with the grayscale value and the pixel gamut coordinate of the inputted RGB pixels.

In one example, three dynamic sub-pixels are adopted to realize the display of five base colors. The pixel gamut is divided by the display control unit 20 to be five triangular areas having corresponding pixel gamut coordinate and displayed color. Specifically, within the XY coordinate system, the pixel color gamut includes five triangular areas including WBR, WCB, WGC, WYG, and WRY. As shown in Table. 1, each of the triangular areas corresponds to one displayed color of the dynamic pixel. The pixel gamut is described as A(x, y). When the coordinate of the pixel gamut is within the corresponding pixel gamut, the display control unit 20 control the dynamic sub-pixel to display corresponding color so as to realize five base colors display using three dynamic sub-pixels. In addition, the display control unit 20 controls the brightness of the sub-pixels in accordance with the grayscale values, i.e., RiGiBi, of the input pixels.

When one dynamic sub-pixel is adopted to display five base colors, the display control unit 20 divide the timing sequences of the pixel gamut. Each of the timing sequences corresponds to one displayed color of the graphene dynamic sub-pixel. The display control unit 20 converts the color in accordance with the grayscale value, i.e., RiGiBi, and the pixel gamut coordinate A(x, y) and determines the displayed colors and the timing sequences. The display control unit 20 selects the source/drain voltage (Vds) and the gate voltage (Vgs) corresponding to the timing sequence to display the color and the brightness.

The graphene display device 100 may accomplish multiple base colors display with fewer pixel such that a wider color gamut coverage may be provided, and thus the aperture rate of the display device may be enhanced and the power consumption may be reduced.

Figure 5:
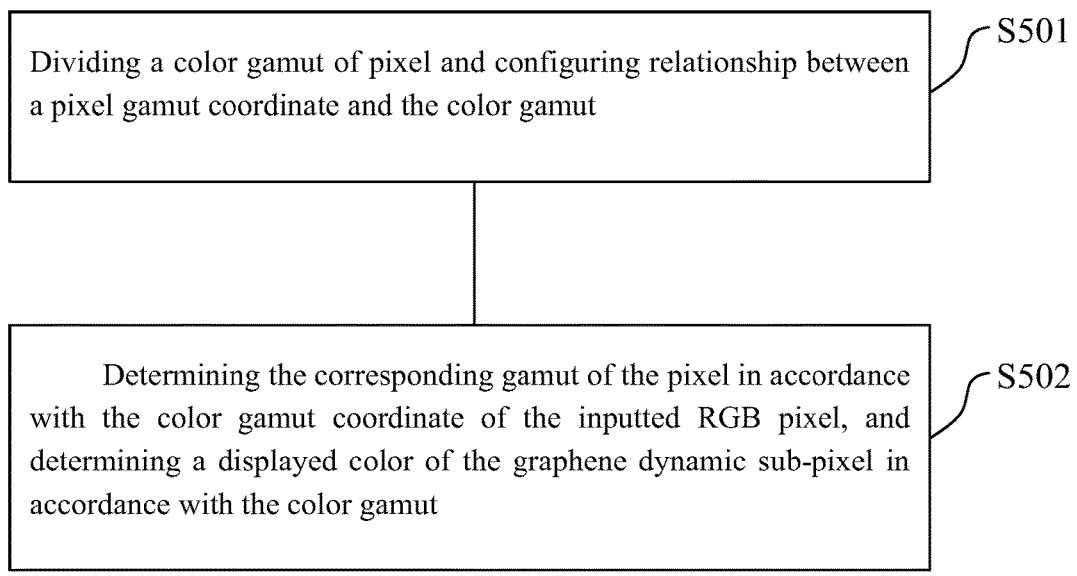
FIG. 5 is a flowchart of the display driving method of the graphene display device in accordance with one embodiment.

FIG. 5 is a flowchart of the display driving method of the graphene display device in accordance with one embodiment. The method includes the following steps.

In step S501, the color gamut of the pixels is divided, and the relationship between the pixel gamut coordinate and the gamut is configured.

In step S501, determining the corresponding gamut of the pixel in accordance with the pixel gamut coordinate of the inputted RGB pixel. In addition, the graphene dynamic sub-pixel corresponding to the gamut is controlled to display the corresponding color. In this step, controlling the brightness of the graphene dynamic sub-pixel in accordance with the grayscale values of the inputted RGB pixel.

Specifically, the display driving method may adopt three graphene dynamic sub-pixels or one graphene dynamic sub-pixel to display the multi-le base colors.

Figure 6:
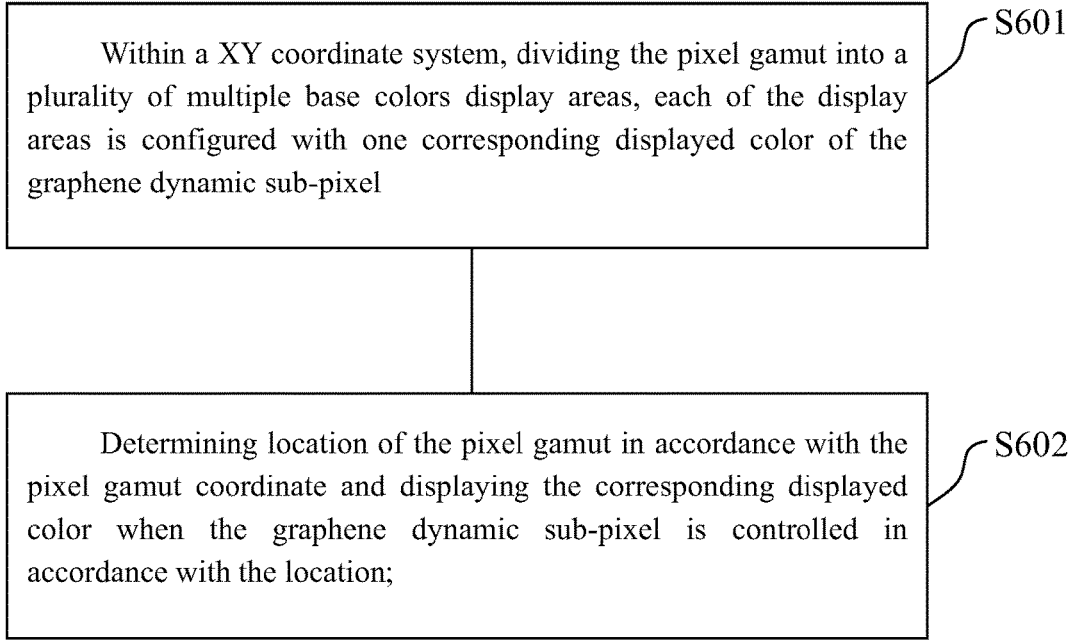
FIG. 6 is a flowchart of a multi-primary display method adopting three dynamic sub-pixels in accordance with one embodiment.

FIG. 6 is a flowchart of a multi-primary display method adopting three dynamic sub-pixels in accordance with one embodiment. The method includes the following steps.

In step S601, within the XY coordinate system, the pixel gamut is divided into display areas of multiple base colors. Each of the display areas is configured with the corresponding displayed color of the graphene dynamic sub-pixel.

Specifically, within the XY coordinate system, the pixel color gamut includes five triangular areas including WBR, WCB, WGC, WYG, and WRY. The triangular areas are configured with predetermined relationship with the displayed colors of the dynamic sub-pixels. Each of the triangular areas has corresponding displayed color of the dynamic sub-pixel.

In step S602, determining the location of the pixel gamut in accordance with the pixel gamut coordinate A(x, y) and displaying the corresponding displayed color when the graphene dynamic sub-pixel is controlled in accordance with the location.

In view of the above, the three dynamic sub-pixel realizes a wide color gamut coverage of five base colors, i.e., RGBYC. In this way, the saturation of the display device is high. At the same time, the number of the sub-pixels is reduced and the aperture rate of the display device may be enhanced.

Figure 7:
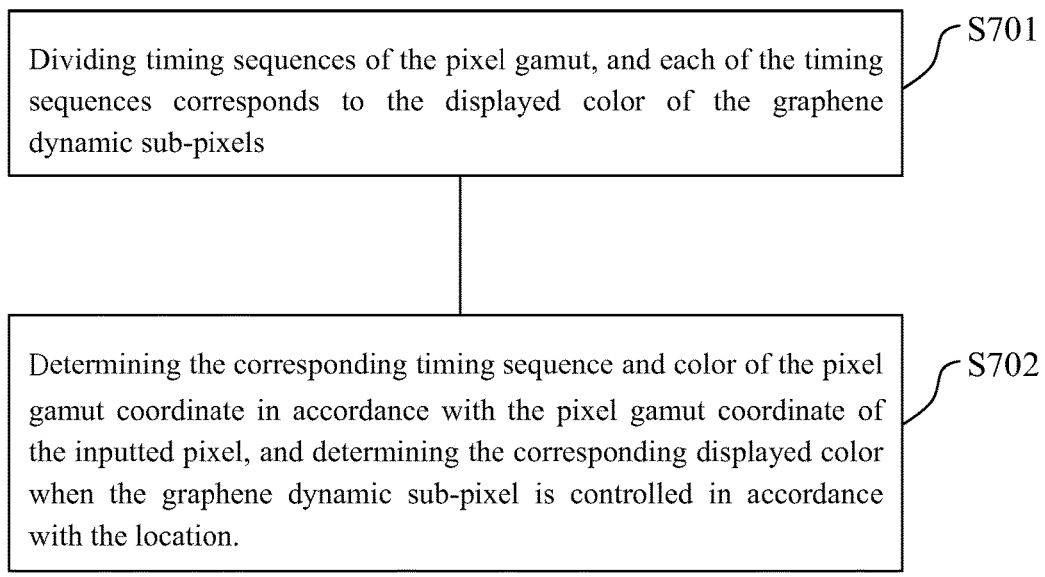
FIG. 7 is a flowchart of a multi-primary display method adopting one dynamic sub-pixel in accordance with one embodiment.

FIG. 7 is a flowchart of a multi-primary display method adopting one dynamic sub-pixels in accordance with one embodiment. The method includes the following steps.

In step S701, timing sequences of the pixel gamut is divided, and each of the timing sequences corresponds to a displayed color of the graphene dynamic sub-pixels.

For instance, within 1/180 seconds, a first color is displayed at a predetermined grayscale when the gate voltage (Vgs) and the source/drain voltage (Vds) are controlled by the inputted timing sequence. Within 2/180 seconds, a second color is displayed at a predetermined grayscale when the gate voltage (Vgs) and the source/drain voltage (Vds) are controlled by the inputted timing sequence. Within 3/180 seconds, a third color is displayed at a predetermined grayscale when the gate voltage (Vgs) and the source/drain voltage (Vds) are controlled by the inputted timing sequence. The lights of the three timing sequences are mix to generate the lights of a predetermined color.

In step S702, determining the corresponding timing sequence and color of the pixel gamut coordinate in accordance with the pixel gamut coordinate of the inputted pixel, and determining the corresponding displayed color when the graphene dynamic sub-pixel is controlled in accordance with the location.

With such timing sequence driving method, the wide color gamut of multiple base colors may be displayed.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A graphene display device, comprising:
a graphene display unit and a display control unit electrically connected with the graphene display unit, the graphene display unit comprises a plurality of graphene light emitting structures constituting dynamic sub-pixels of the graphene display unit, wherein:
each of the light emitting structures comprises a light emitting layer, a gate, a source, and a drain, the gate covers one surface of the light emitting layer, and the source and the drain are respectively arranged at two lateral sides of the light emitting layer;
the graphene display unit is configured for dividing pixel gamut of multiple base colors of pixels of the graphene display unit, a relationship between the pixel gamut and a pixel gamut coordinate is configured, and the graphene display unit controls the dynamic sub-pixel to display corresponding light in accordance with the pixel gamut coordinate of the inputted pixel; and
wherein the gate is arranged on an opposite side of the light emitting layer to the source and the drain.

2. The graphene display device as claimed in claim 1, wherein the display control unit controls a displayed color of the dynamic sub-pixel in accordance with a gate voltage.

3. The graphene display device as claimed in claim 2, wherein the light emitting layer is reduced graphene oxide semiconductor;
and/or the gate is graphene oxide; and
and/or the source and the drain are reduced oxide graphene.

4. The graphene display device as claimed in claim 2, wherein the graphene display unit comprises a first transparent substrate and a second transparent substrate, and the light emitting structure is arranged between the first transparent substrate and the second transparent substrate.

5. The graphene display device as claimed in claim 3, wherein the graphene display unit comprises a first transparent substrate and a second transparent substrate, and the light emitting structure is arranged between the first transparent substrate and the second transparent substrate.

6. The graphene display device as claimed in claim 4, wherein the graphene display device further comprises a protection layer covering the light emitting structure, and the second transparent substrate covers the light emitting structure and the protection layer;
and/or the graphene display unit comprises a masking layer formed on one surface of the first transparent substrate facing toward the second transparent substrate;
and/or the graphene display unit comprises a reflective layer formed on one surface of the first transparent substrate facing away the light emitting structure.

7. The graphene display device as claimed in claim 1, wherein each of the pixels of the graphene display unit comprises three graphene light emitting structures operating as the dynamic sub-pixels, the display control unit controls the three dynamic sub-pixels to display five base colors in accordance with the pixel gamut coordinates of the inputted pixel;
or each of the pixels of the graphene display unit comprises one graphene light emitting structure operating as the dynamic sub-pixel, the display control unit controls the dynamic sub-pixel to display five base colors in accordance with the pixel gamut coordinates of the inputted pixel.

8. The graphene display device as claimed in claim 7, wherein:
when each of the pixels of the graphene display unit comprises three graphene light emitting structures operating as the dynamic sub-pixels, within the XY coordinate system, the pixel color gamut comprises five triangular areas having WBR, WCB, WGC, WYG, and WRY, each of the triangular areas corresponds to one displayed color of the dynamic sub-pixel;
when each of the pixels of the graphene display unit comprises one graphene light emitting structure operating as the dynamic sub-pixel, the display control unit divides the timing sequences of the pixel gamut, each of the timing sequences is configured with one displayed color corresponding to the graphene dynamic sub-pixel, and the displayed color and the timing sequence of the three base colors are determined in accordance with the pixel gamut coordinate of the inputted pixel.

9. A display driving method of graphene display devices, comprising:

dividing a color gamut of a pixel and configuring relationship between a pixel gamut coordinate and the color gamut; and determining the corresponding gamut of the pixel in accordance with the color gamut coordinate of the inputted RGB pixel, and determining a displayed color of the graphene dynamic sub-pixel in accordance with the color gamut; and the graphene display device comprising a graphene display device and a display control unit electrically connected with the graphene display unit, the graphene display unit comprises a plurality of graphene light emitting structures constituting dynamic sub-pixels of the graphene display unit, wherein:

each of the light emitting structures comprises a light emitting layer, a gate, a source, and a drain, the gate covers one surface of the light emitting layer, and the source and the drain are respectively arranged at two lateral sides of the light emitting layer, and wherein wherein the gate is arranged on an opposite side of the light emitting layer to the source and the drain.

10. The method as claimed in claim 9, wherein the method further comprises adopting three graphene dynamic sub-pixels to display multiple base colors, and the step further comprises:

within a XY coordinate system, dividing the pixel gamut into a plurality of multiple base colors display areas, each of the display areas is configured with one corresponding displayed color of the graphene dynamic sub-pixel;

determining location of the pixel gamut in accordance with the pixel gamut coordinate and displaying the corresponding displayed color when the graphene dynamic sub-pixel is controlled in accordance with the location;

or adopting one graphene dynamic sub-pixel to display multiple base colors, and the step further comprises:

dividing timing sequences of the pixel gamut, and each of the timing sequences corresponds to the displayed color of the graphene dynamic sub-pixels; and determining the corresponding timing sequence and color of the pixel gamut coordinate in accordance with the pixel gamut coordinate of the inputted pixel, and determining the corresponding displayed color when the graphene dynamic sub-pixel is controlled in accordance with the location.

* * * * *